(12) United States Patent
Moore et al.

(10) Patent No.: US 11,791,532 B1
(45) Date of Patent: Oct. 17, 2023

(54) MICROWAVE CAVITY RESONATOR AND FIXED-GEOMETRY PROBE

(71) Applicant: Raytheon Company, Waltham, MA (US)

(72) Inventors: Gary Ian Moore, Fremantle (AU); James Andrew Dervay, Hudson, MA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 17/887,043

(22) Filed: Aug. 12, 2022

(51) Int. Cl.
| | | |
|---|---|---|
| *H01P 7/06* | (2006.01) | |
| *G01N 22/00* | (2006.01) | |
| *H03B 5/18* | (2006.01) | |

(52) U.S. Cl.
CPC ............... *H01P 7/06* (2013.01); *G01N 22/00* (2013.01); *H03B 5/1817* (2013.01)

(58) Field of Classification Search
CPC ...... H01P 7/06; H01P 7/00; H01P 7/10; H01P 7/105; H01P 1/20; H01P 1/201; H01P 1/205; H01P 1/202; H01P 1/2053; H01P 1/207; H01P 1/208; H01P 1/2082; H01P 1/2084; H01P 1/2086; G01N 22/00; H03B 5/1817; H03B 5/1823; H03B 5/1829
See application file for complete search history.

(56) References Cited

U.S. PATENT DOCUMENTS 3,209,289 A * 9/1965 Golden ................... H01P 7/06
  333/231
3,516,014 A * 6/1970 Hines .................. H03B 5/1823
  331/117 D (Continued)

FOREIGN PATENT DOCUMENTS

EP  0387705  * 8/1990 ................ H01P 7/10

OTHER PUBLICATIONS

Anstie, James D., "A 50 K Dual-Mode Sapphire Oscillator and Whispering Spherical Mode Oscillators", (Apr. 2006), 220 pgs.

(Continued)

*Primary Examiner* — Stephen E. Jones
(74) *Attorney, Agent, or Firm* — Schwegman Lundberg & Woessner, P.A.

(57) ABSTRACT

A fixed-geometry probe for exchanging microwave energy with a cavity resonator is easy to manufacture, reliable and readily adjustable external to the cavity to select a coupling coefficient. The probe includes a transmission line that enters, turns and exits the cavity resonator. A first end of the transmission line lies outside the cavity resonator for connection to a microwave circuit to exchange microwave energy. A portion of the transmission line's outer conductor(s) is removed within the cavity resonator to form a fixed-geometry radiating element to exchange microwave energy with the cavity resonator in accordance with the coupling coefficient. The line's outer conductor is connected to the cavity resonator on either side of the radiating (Continued)

element. A second end of the transmission line is terminated outside the cavity resonator with a terminating impedance creating a mismatch with the line's characteristic impedance to create a reflective stub. The coupling coefficient is controlled by the length of the reflective stub and terminating impedance.

20 Claims, 8 Drawing Sheets

(56) References Cited

U.S. PATENT DOCUMENTS

| | | |
|---|---|---|
| 4,992,763 A | 2/1991 | Bert et al. |
| 5,200,721 A | 4/1993 | Mansour |
| 5,714,920 A | 2/1998 | Ivanov et al. |
| 6,803,132 B1 | 10/2004 | Alford et al. |
| 7,193,489 B2 | 3/2007 | Kornowski et al. |
| 9,588,061 B2 | 3/2017 | Sun et al. |
| 2010/0156555 A1* | 6/2010 | Richter, Jr. ............... H01P 7/06 333/230 |

OTHER PUBLICATIONS

Evjen, P. M., et al., "AN003 SRD Antennas", Application Note AN003, 18 pgs.

Hartnett, John G., et al., "Optimum Design of a High-Q Room-Temperature Whispering-Gallery-Mode X-Band Sapphire Resonator", IEEE Transactions on Ultrasonics, Ferroelectrics, and Frequency Control, vol. 60, No. 6, (Jun. 2013), 1041-1047.

McNeilage, C., et al., "A Review of Sapphire Whispering Gallery-Mode Oscillators Including Technical Progress and Future Potential of the Technology", Proceedings of the 2004 IEEE International Frequency Control Symposium and Exposition, (2004), 210-218.

* cited by examiner

Fig. 8

MICROWAVE CAVITY RESONATOR AND FIXED-GEOMETRY PROBE

BACKGROUND OF THE INVENTION

Field of the Invention

This invention relates to probes to exchange microwave energy with cavity resonators for use in microwave circuits such as oscillators, particularly sapphire oscillators, and filters.

Description of the Related Art

Modern radar and telecommunications systems require microwave frequency signal sources and signal processing systems with stringent performance requirements and spectral purity. Specifically, sub-systems such as oscillators and filters that exhibit these properties are required.

Cavity resonators by their nature provide discrimination of wanted signals from unwanted signals. The purity and stability of the signals produced is directly linked to the resonator used as the frequency determining device and is dependent upon its Q-factor, power handling ability and its immunity to vibrational and temperature related effects.

A microwave cavity resonator is typically a closed metallic structure (e.g., a metallic cylinder) and resonates with higher amplitude at specific set frequencies, called resonant frequencies. When microwave energy passes through the cavity, the resonator acts as a band-pass filter and passes the microwave energy at the resonant frequencies while blocking other nearby frequencies. The resonant frequencies and the corresponding electric and magnetic field patterns or modes of the cavity resonator depend on its dimensions (length, width, height), dielectric constant and magnetic permeability of the material of construction.

A piece of dielectric material often referred to as a "puck" may be placed inside the cavity resonator to improve its Q-factor. Typical dielectric materials include rutile, various proprietary ceramics based on compound oxides of titanium and rare metal elements and Sapphire. Sapphire is often preferred because it provides the highest Q factor of any known material in the microwave frequency domain. The dimensions of the puck are often determined by experiment or by solving Maxwell's equations for the particular material and prescribed mode and frequency at a determined temperature.

The cavity resonator further includes one or more microwave coupling elements known as "probes" that penetrate the walls of the cavity resonator to exchange microwave energy with fields inside the cavity. Each probe couples microwave energy into or out of the cavity resonator. A probe typically comprises a radiating element inside the cavity and a transmission line to carry microwave energy to/from the radiating element. The exchange of microwave energy is characterized by a coupling coefficient (energy in/energy out) that lies in the range of 0 to 1 where 1 is referred to as "critical coupling". When the coefficient is near zero, most of the microwave energy is reflected. When the coefficient is near 1 the probe is said to be well-matched with only a small amount being reflected. Well known formulae relate the coupling parameters to the scattering or "S" parameters used to model the behavior of a cavity resonator. For additional detail regarding S-parameters and coupling coefficients see James D. Anstie "A 50 K Dual-Mode Sapphire Oscillator and Whispering Spherical Mode Oscillators" Ph.D. Thesis, University of Western Australia, April, 2006.

The coupling coefficients are very sensitive to probe geometry and dimensions. Commonly probe design is a largely empirical exercise of adjustment until a final geometry and set of dimensions is determined. It is common that the final performance of the probe will be subject to variation due to manufacturing tolerances in both the probe and cavity. The commonly used probe is a coaxial cable that is terminated with a "continuous loop" of wire that connects the inner and outer conductors. Microwave energy is exchanged between the continuous loop (radiating element) and cavity. Once the loop dimensions are fixed, the coupling coefficient may be adjusted by changing the probe's depth of penetration into the cavity.

Figure 1:
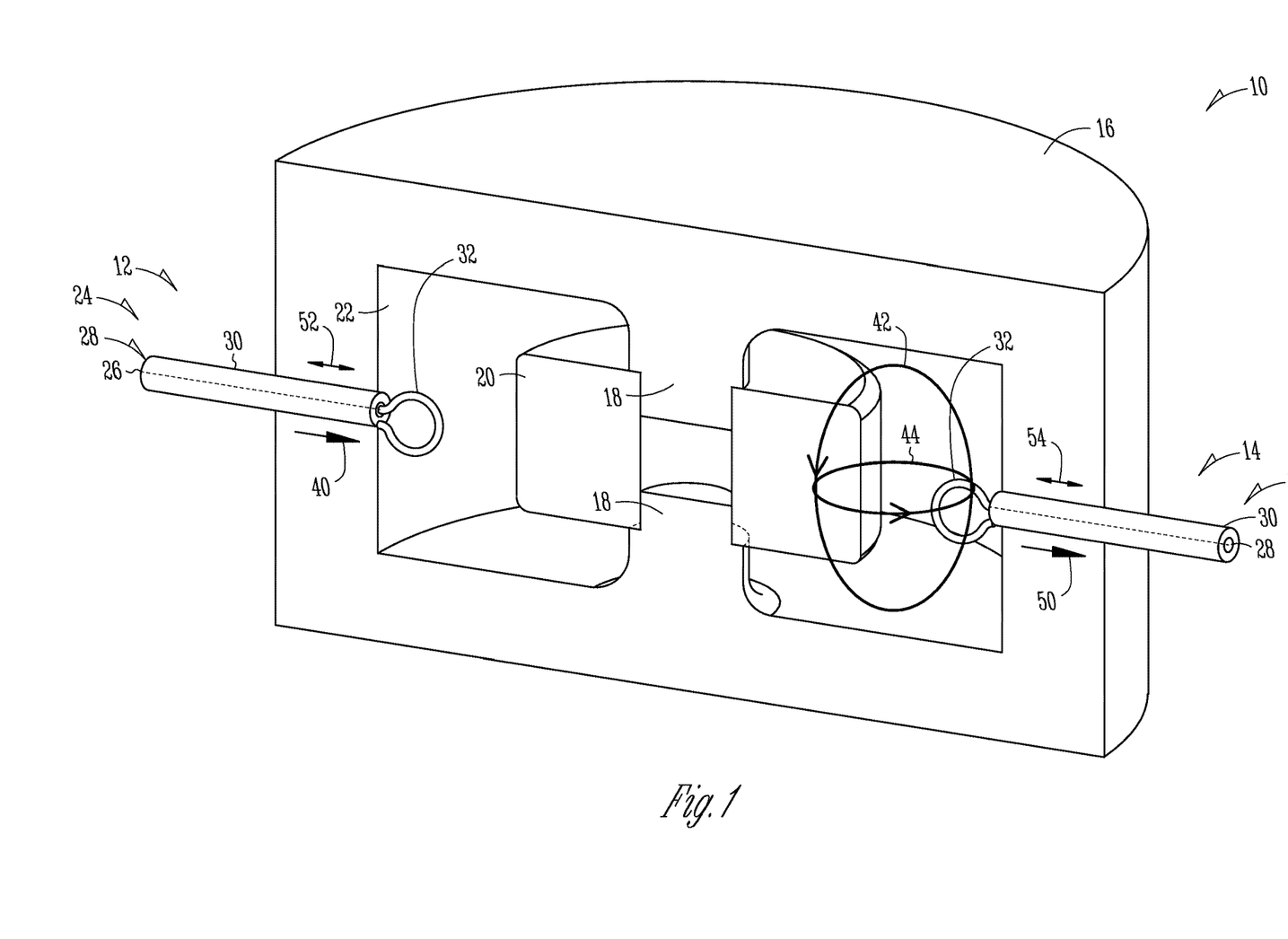
FIG. 1, as described above, illustrates a cavity resonator utilizing continuous-loop probes for exchanging microwave energy with a cavity resonator.

As shown in FIG. 1, an embodiment of a cavity resonator 10 includes input and output continuous-loop probes 12 and 14 that penetrate the walls of the cavity resonator. The resonator is suitably a conductive (metal) cylinder 16 having a central post structure 18 (e.g., a pair of opposing posts attached to the top and bottom of the resonator with a gap separating the posts) that holds an annular Sapphire puck 20 in the center of a cavity 22 defined by the inner walls of the resonator. The cavity resonator and puck are dimensioned to provide the desired resonant frequencies. Each probe includes a coaxial cable 24 having an inner conductor 26, a dielectric cladding layer 28 and an outer conductor 30. A continuous loop of wire 32 connects the inner conductor 26 to the outer conductor 30 forming a radiating element. The diameter of the continuous loop may be constrained by the diameter of the coaxial cable so that the cable "fits" the hole in the wall unless more complex assembly techniques are used.

Microwave energy 40 flows through coaxial cable 24 of input probe 12 into the cavity 22 where it is injected into the cavity via the continuous loop of wire 32 that forms the radiating element. The flow of microwave energy into the cavity creates the electric (E) and magnetic (B) fields 42 and 44 within the cavity 22 that induce the flow of current in the walls of the cavity resonator. Microwave energy 50 is extracted from the cavity via continuous loop of wire 32 of output probe 14. The penetration depth of each probe into the cavity 22 is adjusted 52, 54 to change the geometry of the probe inside the cavity thus changing the coupling coefficient to a desired value. Typically, the probes are aligned such that their near field radiation pattern is aligned to the direction of energy flow in the resonant field in order to provide a useful level of coupling.

SUMMARY OF THE INVENTION

The following is a summary of the invention in order to provide a basic understanding of some aspects of the invention. This summary is not intended to identify key or critical elements of the invention or to delineate the scope of the invention. Its sole purpose is to present some concepts of the invention in a simplified form as a prelude to the more detailed description and the defining claims that are presented later.

The present invention provides a fixed-geometry probe for exchanging microwave energy with a cavity resonator that is easier to manufacture, more reliable and readily adjustable external to the cavity to select a coupling coefficient without changing the fixed-geometry of the radiating element inside the cavity.

The probe includes a transmission line that enters, turns and exits a microwave cavity resonator. A first end of the transmission line lies outside the cavity resonator for connection to a microwave circuit to exchange microwave energy. A portion of the transmission line's outer conductor (s) is removed within the cavity resonator to form a fixed-geometry radiating element to exchange microwave energy with the cavity resonator in accordance with a coupling coefficient. The line's outer conductor is connected to the cavity resonator on either side of the radiating element. A second end of the transmission line is terminated outside the cavity resonator with a terminating impedance creating a mismatch with the line's characteristic impedance to create a reflective stub. The coupling coefficient is controlled by the length of the reflective stub and terminating impedance.

In different embodiments, the reflecting stub may be terminated with an open circuit, a short circuit or a finite impedance value. In all three cases, the length of the reflecting stub may be trimmed external to the cavity resonator to control the coupling coefficient. For example, the reflecting stub may be nominally designed to provide a coupling coefficient near zero and trimmed to increase coupling until the desired coefficient is reached. For the short circuit and finite impedance cases, the terminating impedance must be removed, the transmission line trimmed, and the terminating impedance replaced at each iteration. The open circuit termination is much simpler and thus preferred.

In an embodiment in which the reflecting stub is terminated with a finite terminating impedance the coupling coefficient may be selected or tuned by the value of the finite terminating impedance. This value can be tuned, for example, by replacing the terminating impedance with one of a different impedance value or using electrical impedance tuning. In these cases, the length of the reflective stub is fixed.

In an embodiment, the transmission line is a coaxial cable including an inner conductor, a dielectric layer around the inner conductor and an outer conductor around the dielectric layer. The coaxial cable enters the cavity through a first hole in a boundary wall of the cavity resonator turns form a U-shaped bend at the radiating element (where the outer conductor is removed) and exits through a second hole in the boundary wall. The outer conductor is suitably soldered or brazed to connect it to the boundary wall.

In an embodiment, the transmission line is a stripline including a planar inner conductor sandwiched between dielectric layers sandwiched between planar outer conductors. The planar inner conductor is patterned to form a U-shaped transmission line. The planar outer conductors are removed inside the cavity resonator to form the radiating element. The outer conductor(s) are suitably soldered or brazed to connect the conductor(s) to the boundary wall. The stripline may be terminated in a set or tunable terminating impedance to control the coupling coefficient. Alternately, the stripline may transition to a non-stripline transmission line such as a microstrip, co-planar waveguide, coaxial cable or other topology in which trimming of its length is more readily achieved to control the coupling coefficient.

In an embodiment, a sapphire oscillator comprises input and output probes configured to inject and extract microwave energy from a cavity resonator including a sapphire puck. The fixed-geometry probes may be independently set or tuned to provide the desired input and output coupling coefficients. The input probe is configured to receive amplified microwave energy at the microwave operating frequency and the output probe is configured to deliver microwave energy at the microwave operating frequency to a microwave coupler, which is configured to send a first portion of the microwave energy into a loop and a second portion to an output. A phase shifter is configured to set a phase at N*2pi around the loop to satisfy a condition for the sapphire oscillator to oscillate. A mode selection filter is configured to select a mode of the cavity resonator at the microwave operating frequency and an amplifier is configured to provide the amplified microwave energy to the cavity resonator and sufficient gain for the loop to oscillate.

These and other features and advantages of the invention will be apparent to those skilled in the art from the following detailed description of preferred embodiments, taken together with the accompanying drawings, in which:

DETAILED DESCRIPTION OF THE INVENTION

The present invention provides a fixed-geometry probe for exchanging microwave energy with a cavity resonator that is easier to manufacture, more reliable and readily adjustable external to the cavity to select a coupling coefficient without changing the fixed-geometry of the radiating element inside the cavity. The fixed-geometry probe is configurable for frequencies between 1 and 50 GHz in the microwave band and can be used in single or dual probe structures for oscillators, filters or other microwave circuits.

Figure 2:
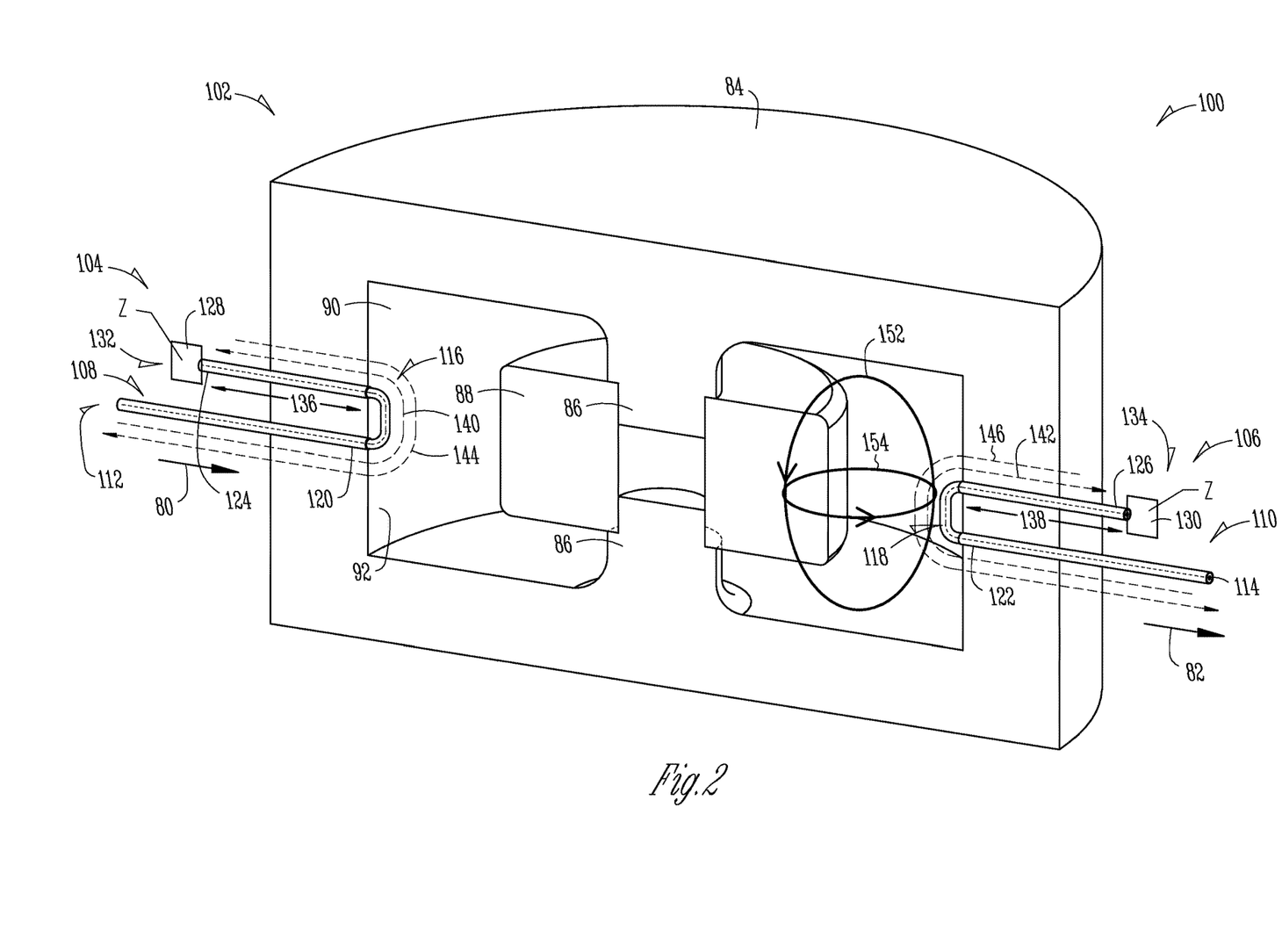
FIG. 2 illustrates an embodiment of a fixed-geometry probe formed from a coaxial cable for exchanging microwave energy with a cavity resonator.

Referring now to FIG. 2, in an embodiment a cavity resonator and probe structure 100 includes a dielectric-loaded cavity resonator 102 and input and output probes 104 and 106, respectively to inject microwave energy 80 into and to extract microwave energy 82 out of the cavity resonator, respectively. In this particular embodiment, which may be suitable for a whispering-gallery-mode configuration, cavity resonator 102 includes a conductive (metal) cylinder 84 having a central post structure 86 (e.g., a pair of opposing posts attached to the top and bottom of the resonator with a gap separating the posts) that holds an annular Sapphire puck 88 in the center of a cavity 90 defined by the boundary walls 92 of the resonator.

The input (output) probe 104 (106) includes a transmission line 108 (110) such as a coaxial cable that enters, turns and exits the cavity resonator 102. A first end 112 (114) of the transmission line lies outside the cavity resonator for connection to a microwave circuit (microwave source) to exchange microwave energy. A portion of the transmission line's outer conductor(s) 120 (122) is removed within the cavity resonator to form a fixed-geometry radiating element 116 (118) to exchange microwave energy with the cavity resonator in accordance with a coupling coefficient. The line's outer conductor 120 (122) is connected (e.g., via soldering or brazing) to boundary walls 92 of the cavity resonator 102 on either side of the radiating element. Preferably, the entire outer conductor that lies within the cavity is removed such that the radiating element extends from wall-to-wall to minimize/eliminate any additional conductors inside the cavity. Any of the outer conductor that remains may degrade the cavity, complicate the design or degrade the coupling coefficient. A second end 124 (126) of the transmission line is terminated outside the cavity resonator with a terminating impedance 128 (130) creating a mismatch with the line's characteristic impedance ZO to create a reflective stub 132 (134). The coupling coefficient is controlled by the length 136 (138) of the reflective stub and the value of the terminating impedance 128 (130).

The reflective stub acts as a reflecting element but with some phase shift associated with the length of the stub and value of the terminating impedance. Thus, there are two components to the microwave energy travelling through the radiating element: the component 140 (142) that was exchanged with a microwave source or the cavity resonator traveling forward and the component 144 (146) reflected off the stub. The phase relationship between these components could be such that they are "in phase" and their respective radiation contributions will reinforce leading to good transfer of power into the cavity, or they could be "out of phase" such that the radiation into the cavity is diminished. In the latter case the signal reflected by the stub would continue and exit the probe augmenting the reflection seen at the probe input as would be expected in a poorly coupled probe.

In different embodiments, the reflecting stub may be terminated with an open circuit, a short circuit or a finite impedance value. In all three cases, the length of the reflecting stub may be trimmed external to the cavity resonator to control the coupling coefficient without changing the fixed-geometry of the radiation element within the cavity resonator. For example, the reflecting stub may be nominally designed to provide a coupling coefficient near zero and trimmed to increase coupling until the desired coefficient is reached. For the short circuit and finite impedance cases, the terminating impedance must be removed, the transmission line trimmed, and the terminating impedance replaced at each iteration. The open circuit termination is much simpler and thus usually preferred.

In an embodiment in which the reflecting stub is terminated with a finite terminating impedance the coupling coefficient may be selected or tuned by the value of the finite terminating impedance. This value can be tuned, for example, by replacing the terminating impedance with one of a different impedance value or using electrical impedance tuning. In these cases, the length of the reflective stub is fixed.

Whether trimming the length of the reflective stub or changing/tuning the value of the terminating impedance, in neither case is the geometry of the radiating element within the cavity changed once the outer conductor is connected to the inner boundary wall of the cavity resonator. Trimming the length of the reflective stub or changing the terminating impedance has the effect of changing the pattern of current flowing in the probe during a cycle of the microwave energy waveform, which in turn adjusts the coupling coefficient. This improves the manufacturability and reliability of the probe structure.

Microwave energy 80 flows through input probe 104 into the cavity 118 where it is injected into the cavity via the input probe's radiating element 116. The flow of microwave energy into the cavity creates the electric (E) and magnetic (B) fields 152 and 154 within the cavity 90 that induce the flow of current in the walls of the cavity resonator and sapphire puck 88. For example, in whispering gallery mode resonators, the field patterns consist of a series of nodes and antinodes spaced azimuthally around the cavity depending on the chosen mode order. Typically orders between 5 and 15 are used in sapphire loaded cavity resonators. To visualize the field patterns in one such resonator, at each antinode the B field circulates in the equatorial plane while the E field circulates in a radial plane containing the cavity axis, the currents induced in the surface of the cavity wall will also circulate in a manner consistent with the E field. Microwave energy 82 is extracted from the cavity via the output probe's radiating element 118. Typically, the probes are aligned such that their near field radiation patterns are is aligned to the direction of energy flow in the resonant field at the probe locations.

In an embodiment, the cavity resonator 102 includes a bottom portion including a circular base, boundary walls 92 that extend from the base the full length of the cavity and a bottom portion of the post structure 86 that extends from the base a little less than half-way and a top portion including a lid and a top portion of the post structure 86 that extends a little less than halfway. Holes are formed through the walls in the bottom portion of the cavity resonator. Each probe is fed through a hole, turned inside the cavity preferably to form a U-shape bend, and exits through a pair hold. The outer conductors are removed within the cavity and connected (e.g., solder or brazed) to the boundary wall 92 on either side of the radiating element to fix the geometry of the radiating elements. Other configurations and methods of assembly will be obvious to one of ordinary skill in the art.

As shown and as is typical a pair of input and output probes are normally used to inject and extract microwave energy from the cavity resonator. However, a single probe can be used to inject microwave energy into the cavity resonator with the reflected component providing the output microwave energy. For example, this type of cavity may be used as a frequency discriminator to control another oscillator or microwave signal source.

Figure 3:
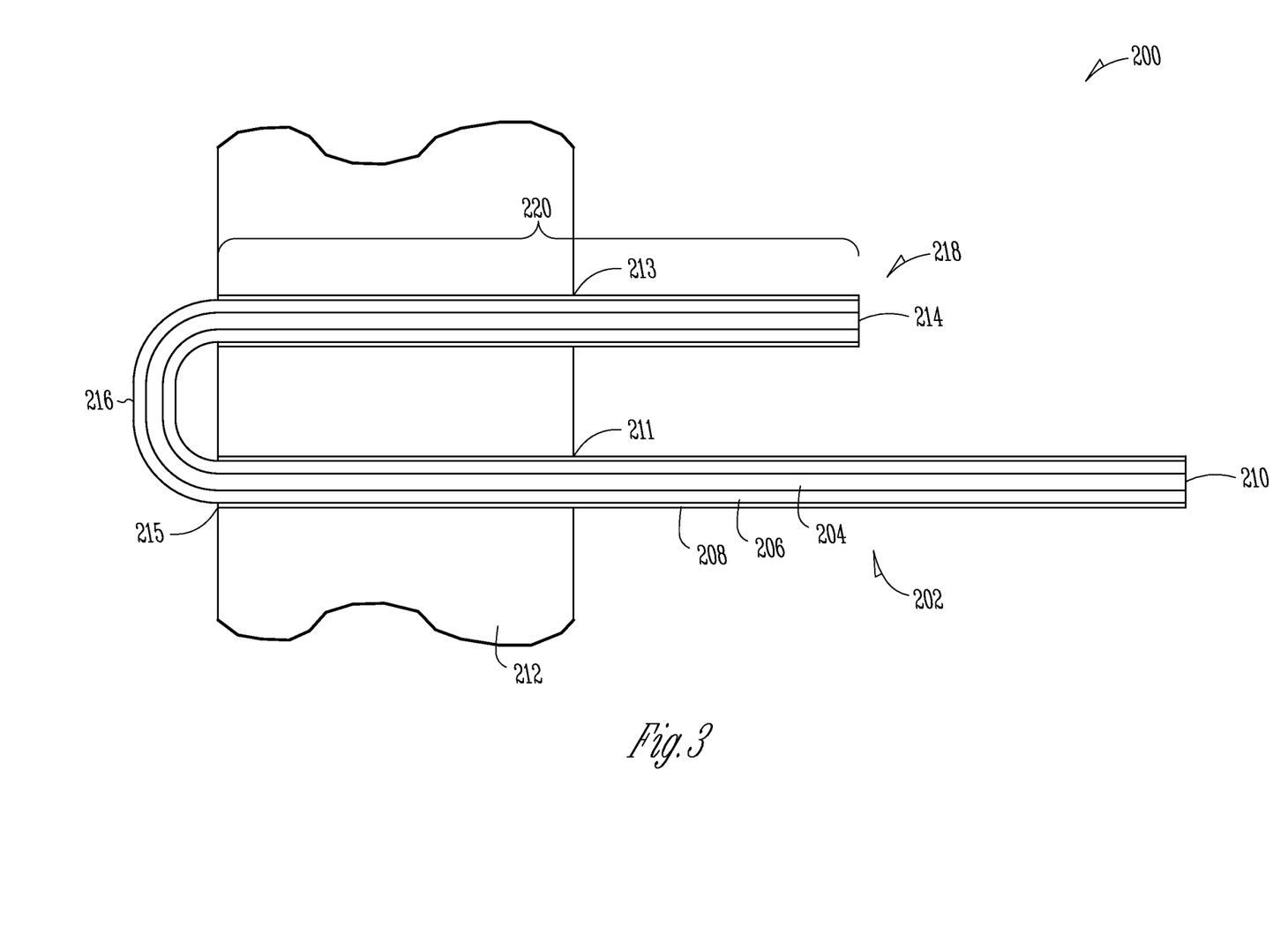
FIG. 3 illustrates an embodiment of the probe in which a reflective stub of the coaxial cable is terminated as an open-circuit and whose length controls the coupling coefficient.

Referring now to FIG. 3, in an embodiment, a probe 200 includes a coaxial cable 202 having an inner conductor 204, a dielectric layer 206 and an outer conductor 208 arranged to provide a characteristic impedance at the microwave operating frequency. A first end 210 of coaxial cable 202 lies outside a cavity resonator and is configured for connection to a microwave circuit (source) to exchange microwave energy. The coaxial cable enters the cavity resonator through a hole 211 in wall 212, turns and exits the cavity resonator through a hole 213 in wall 212. In some embodiments, the coaxial cable may enter and exit different walls. The coaxial cable continues to a second end 214 lying outside the cavity resonator. A portion of the outer conductor 208 is removed from the coaxial cable lying within the cavity resonator to form a fixed-geometry radiating element 216 to exchange microwave energy with the cavity resonator in accordance with a coupling coefficient. The outer conductor 208 is connected to wall 212 of the cavity resonator on either side of the radiating element, suitably at an interior boundary wall 215 of the cavity. In this embodiment, the second end 214 of the coaxial cable is terminated with an open-circuit creating a mismatch with the characteristic impedance to create a reflective stub 218 comprising a length 220 of the coaxial cable between the radiating element 216 and the second end 214. The coupling coefficient is controlled by the length of the length 220 of reflective stub 218.

Figure 4:
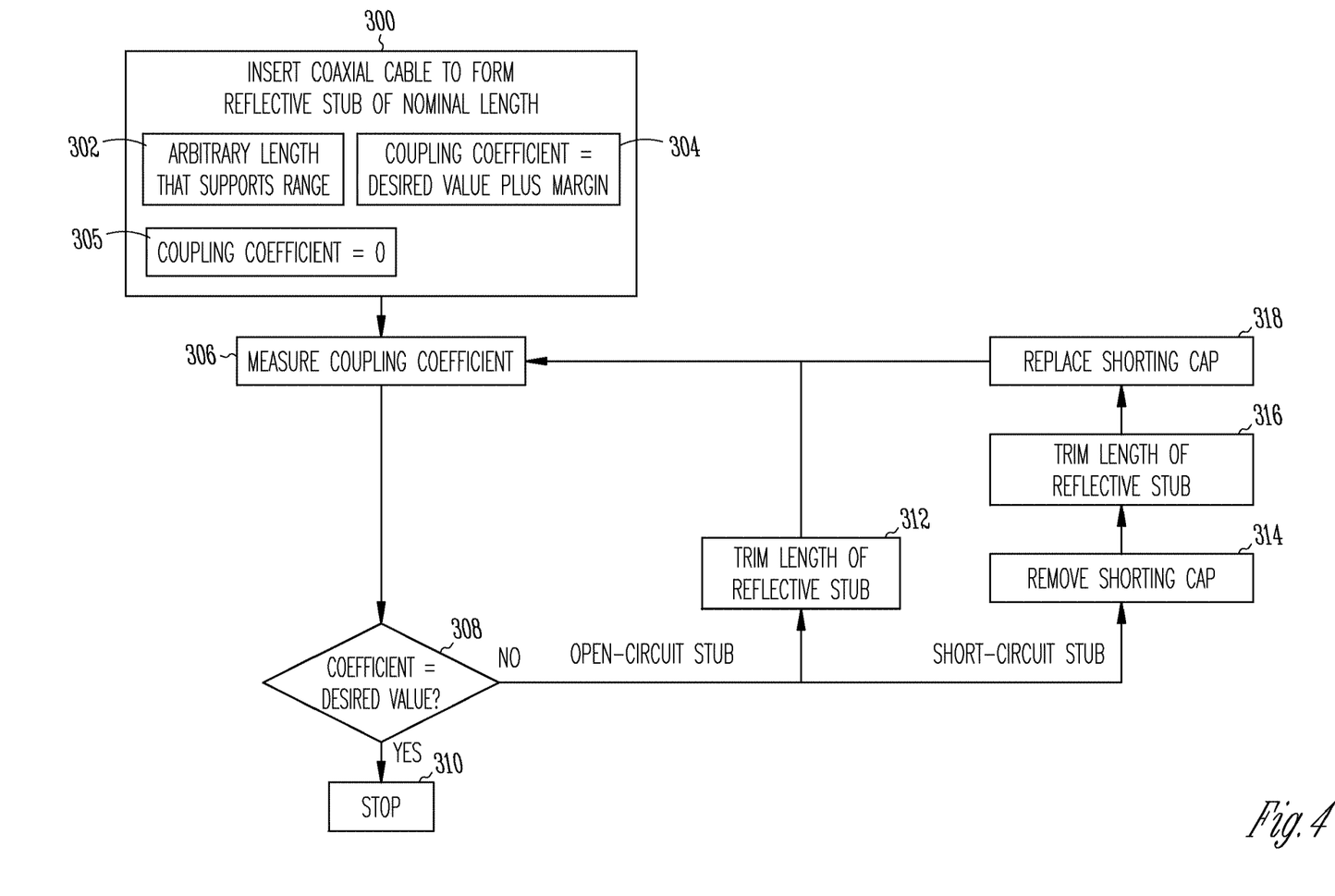
FIG. 4 illustrates an embodiment of a method for trimming the length of the reflective stub to achieve a desired coupling coefficient.

Referring now to FIG. 4, the coupling coefficient can be controlled by trimming the length of the coaxial cable, or more generally the transmission line. This is true whether the reflective stub is terminated in an open-circuit, short-circuit or finite terminating impedance although the open-circuit is a simpler procedure. In step 300, the coaxial cable is inserted through the holes in the wall of the cavity resonator to form a reflective stub of some nominal length. Most generally, the nominal length can be arbitrary as long as it is sufficient to span a desired running range of the coupling coefficient e.g., the full range from 0 to 1 or a portion thereof (step 302). Alternately, the nominal length can be calculated or determined by experiment to provide a close to the desired coupling coefficient plus some marginal length to account for design and manufacturing tolerances (step 304). In another approach, the nominal length can be calculated as the length of the reflective stub to set the desired coupling coefficient at or near zero (step 305) such that initial trimming the length of the reflective stub always increases the coefficient.

Once the coaxial cable is positioned and connected to the walls of the cavity resonator such that the geometry of the radiating element inside the cavity is fixed, the coupling coefficient is measured (step 306). This may be accomplished, for example, by connecting the cavity resonator and probe to a vector network analyzer that measures the scattering (S) parameters, S11 is complex ratio of reflected power to input power, S21 is ratio of power received at port 2 relative to power at port 1 etc., as well as the Q of the coupled cavity. A known set of equations converts the Q and S parameters to the coupling coefficients.

If the measured coefficient is within a specified bound of the desired coefficient value (step 308) the process stops (step 310). In some applications, the design equations may be sufficient well specified and the manufacturing processes of the cavity resonator and probe sufficiently well controlled that the nominal length (when designed for the desired coupling coefficient) is sufficient without further trimming.

If not, if the reflecting stub is terminated in an open-circuit, the length of the reflective stub (e.g., the tail of the coaxial cable) is trimmed by some incremental amount (step 312), the coupling coefficient is measured (step 306) and the process is repeated until the desired value of the coupling coefficient is obtained at step 308. This is a very simple process to accurately and reliable tune the probe to the desired coupling coefficient that does not change the geometry of the radiating element inside the cavity.

Alternately, if the reflective stub was terminated with a short-circuit by, for example, placing a shorting cap over the exposed end of the coaxial cable, the shorting cap would have to removed (step 314), the length of the reflective stub trimmed (step 316), the shorting cap replaced (step 318) and the process repeated until the desired coupling coefficient was obtained. Note, the same process would apply if the reflective stub was terminated with a fixed finite impedance. Either way, when operating in the microwave frequency domaining its generally undesirable to repeatedly remove and replace the terminating impedance. This is why the open-circuit termination is preferable.

Figure 5:
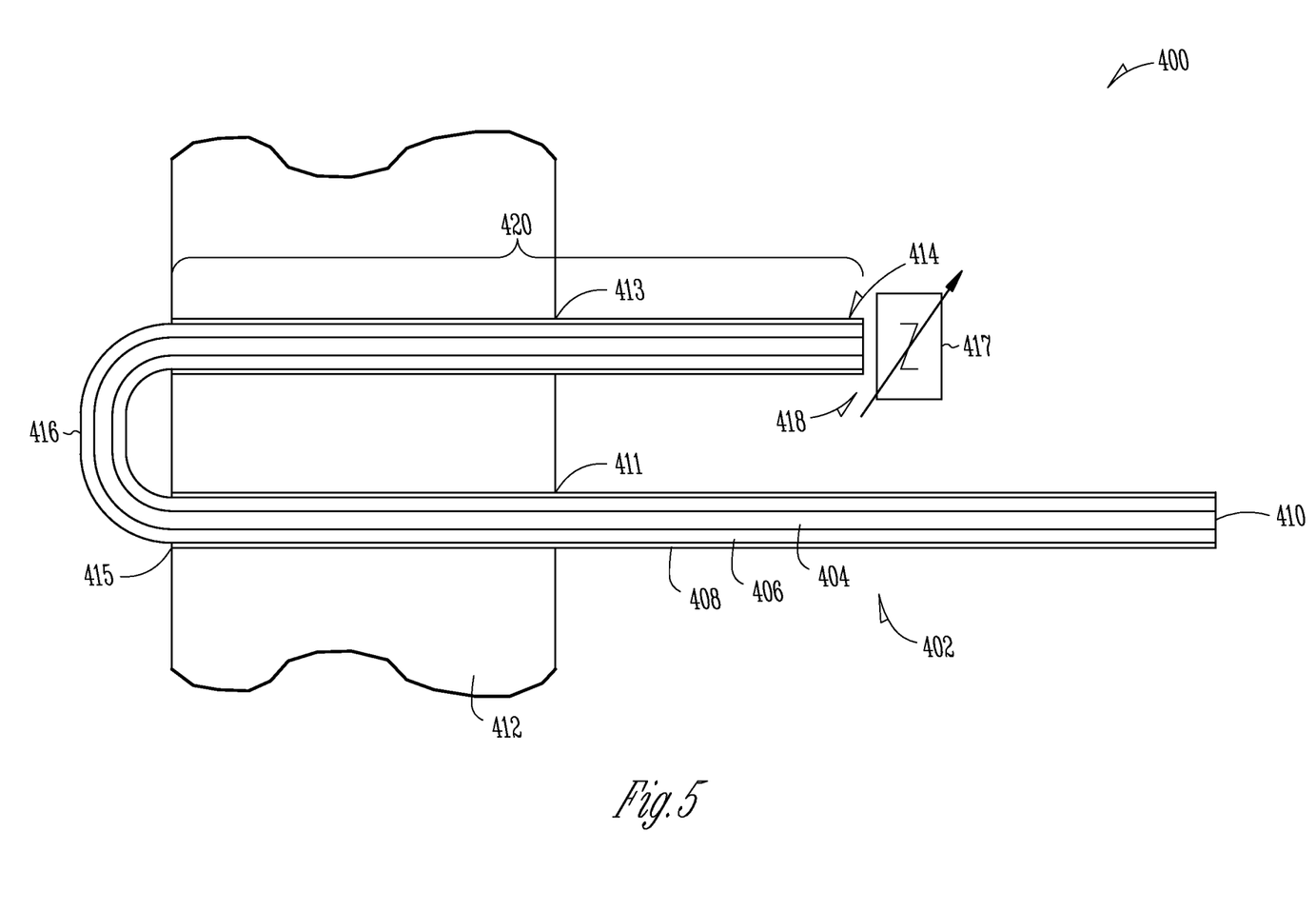
FIG. 5 illustrates an embodiment of the probe in which the reflective stub is terminated with a terminating impedance whose selectable or tunable value controls the coupling coefficient.

Referring now to FIG. 5, in an embodiment, a probe 400 includes a coaxial cable 402 having an inner conductor 404, a dielectric layer 406 and an outer conductor 408 arranged to provide a characteristic impedance at the microwave operating frequency. A first end 410 of coaxial cable 402 lies outside a cavity resonator and is configured for connection to a microwave circuit (source) to exchange microwave energy. The coaxial cable enters the cavity resonator through a wall 412, turns and exits the cavity resonator through wall 412. In some embodiments, the coaxial cable may enter and exit different walls. The coaxial cable continues to a second end 414 lying outside the cavity resonator. A portion of the outer conductor 408 is from the coaxial cable lying within the cavity resonator to form a fixed-geometry radiating element 416 to exchange microwave energy with the cavity resonator in accordance with a coupling coefficient. The outer conductor 408 is connected to wall 412 of the cavity resonator on either side of the radiating element. In this embodiment, the second end 414 of the coaxial cable is terminated with a finite terminating impedance 417 creating a mismatch with the characteristic impedance to create a reflective stub 418 comprising a length 420 of the coaxial cable between the radiating element 416 and the second end 414 and the terminating impedance 417. The length of the reflective stub is fixed. The coupling coefficient is controlled by the setting or tuning the terminating impedance 417.

Figure 6:
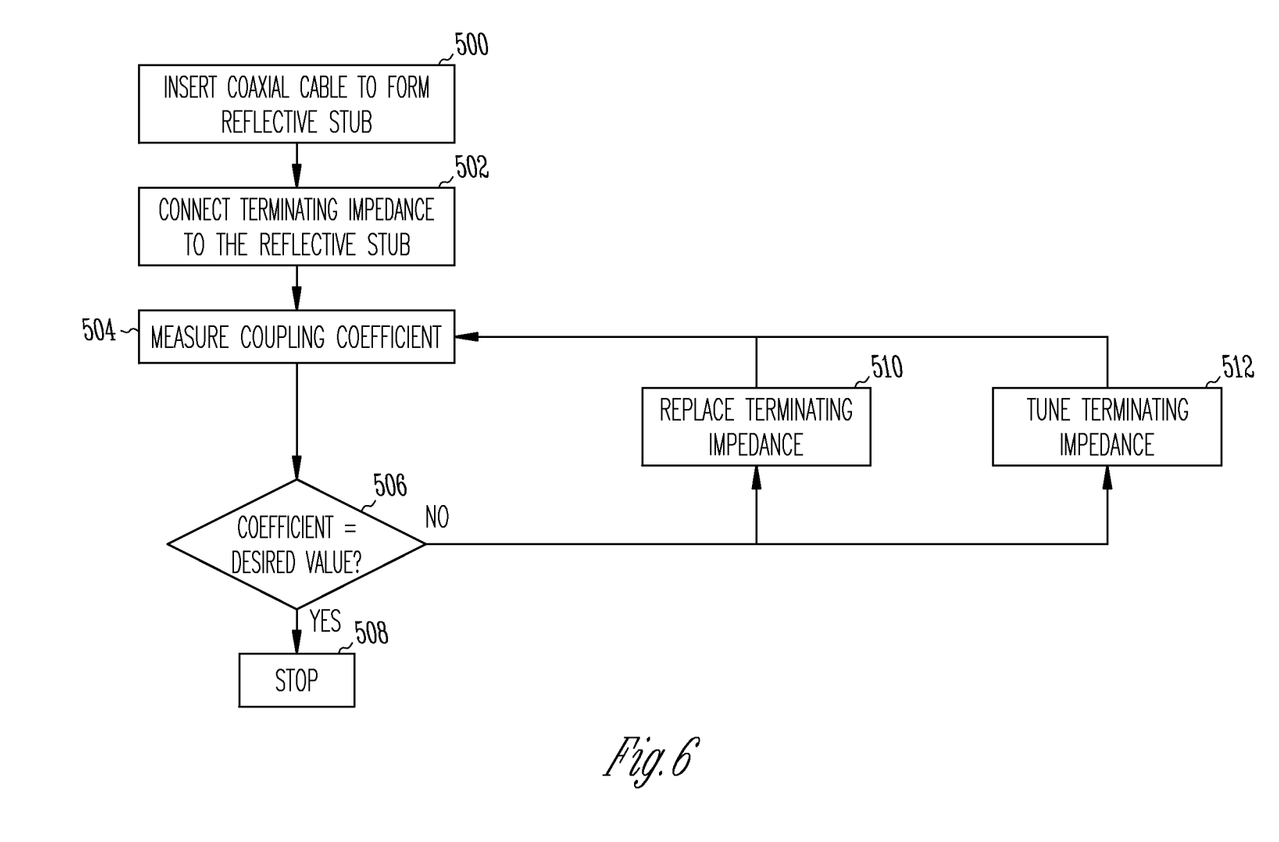
FIG. 6 illustrates an embodiment of a method for selection or tuning of the terminating impedance to achieve a desired coupling coefficient.

Referring now to FIG. 6, the coupling coefficient can be controlled by selecting or tuning the value of the terminating impedance. In step 500, the coaxial cable is inserted through the holes in the wall of the cavity resonator to form a reflective stub of some nominal length. The nominal length is suitably calculated with a nominal value of the terminating impedance to produce the desired coupling coefficient. In step 502, a terminating impedance having the nominal value or close is connected to the reflective stub. The coupling coefficient is measured (step 504) and compared to the desired value of the coupling coefficient (step 506). If the measured coefficient is close enough the process stops (step 508). Otherwise the value of the terminating impedance is adjusted. In one case, the current terminating impedance is disconnected and a terminating impedance of a different value is connected to the reflecting stub (step 510). In another case, the value of the terminating impedance is directly tuned (step 512) e.g., an electronically tuned impedance, such as may be provided by a reverse-biased varactor diode, in a microwave circuit on a printed circuit board (PCB) connected to the coaxial cable.

Figure 7:
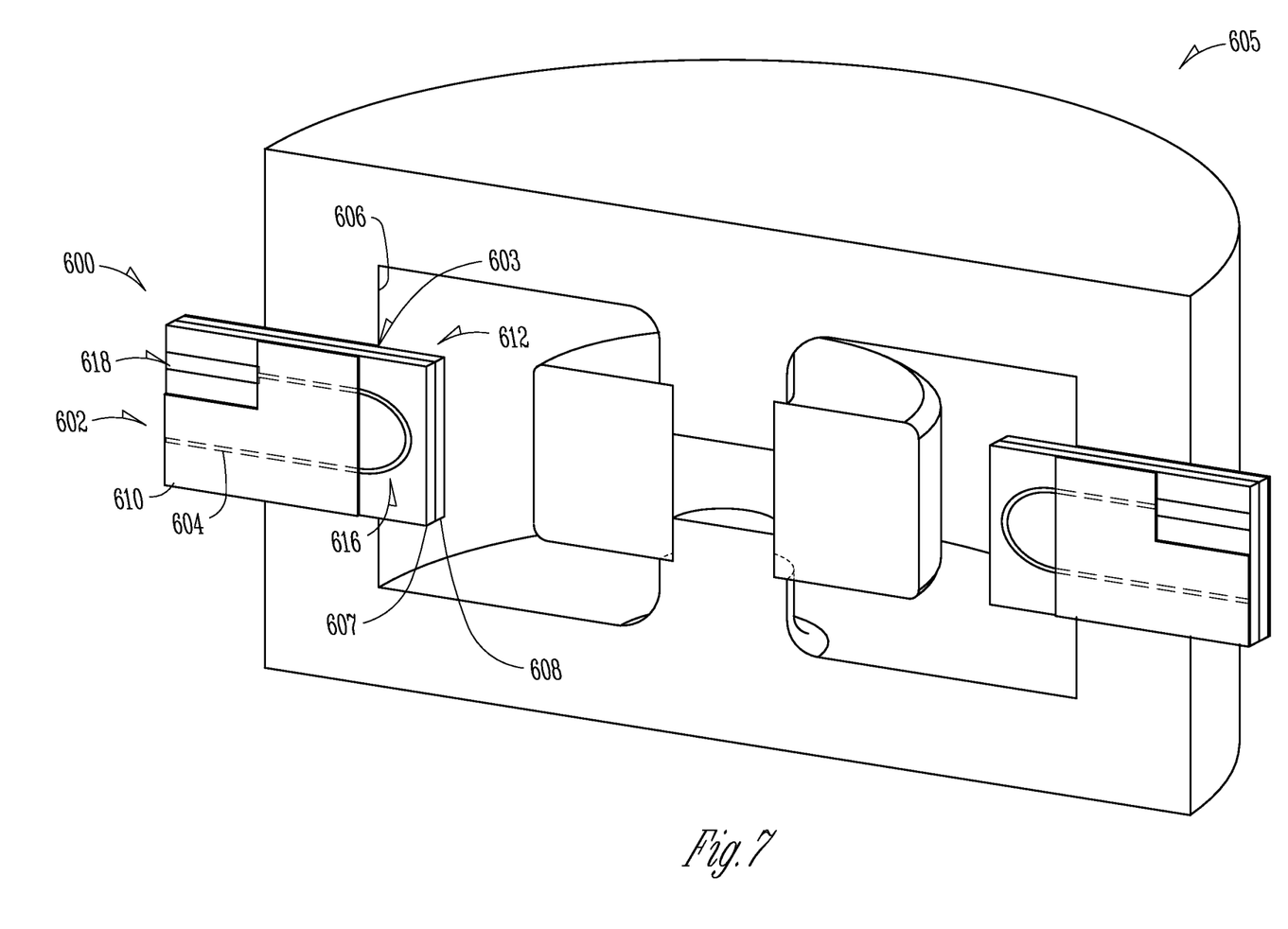
FIG. 7 illustrates an embodiment of a probe formed from a stripline that transitions to a non-stripline transmission line for exchanging microwave energy with a cavity resonator.

Referring now to FIG. 7, in another embodiment, a probe 600 is formed as a stripline 602 that passes through an aperture 603 in a boundary wall 606 of a cavity resonator 605. Stripline 602 includes a planar inner conductor 604 sandwiched between dielectric layers 607 and 608 and planar outer conductors 610 and 612. The planar inner conductor 604 is patterned to form a U-shaped transmission line. The planar outer conductors 610 and 612 are patterned to remove the conductive material inside the cavity to form a radiating element 616 at the U-shaped bend. The planar outer conductors 610 and 612 are connected to the boundary wall 606 on either side of the aperture 603. The stripline may be terminated in a set or tunable terminating impedance to control the coupling coefficient. Alternately, the stripline may transition to a non-stripline transmission line 618 such as a microstrip, co-planar waveguide, coaxial cable or other topology which may be easily trimmed to control the coupling coefficient. As shown, microstrip 618 is formed by removing a portion of one of the outer conductors and dielectric layer to expose the planar inner conductor 604, whose width has been adjusted to maintain the characteristic impedance ZO in the microstrip.

Figure 8:
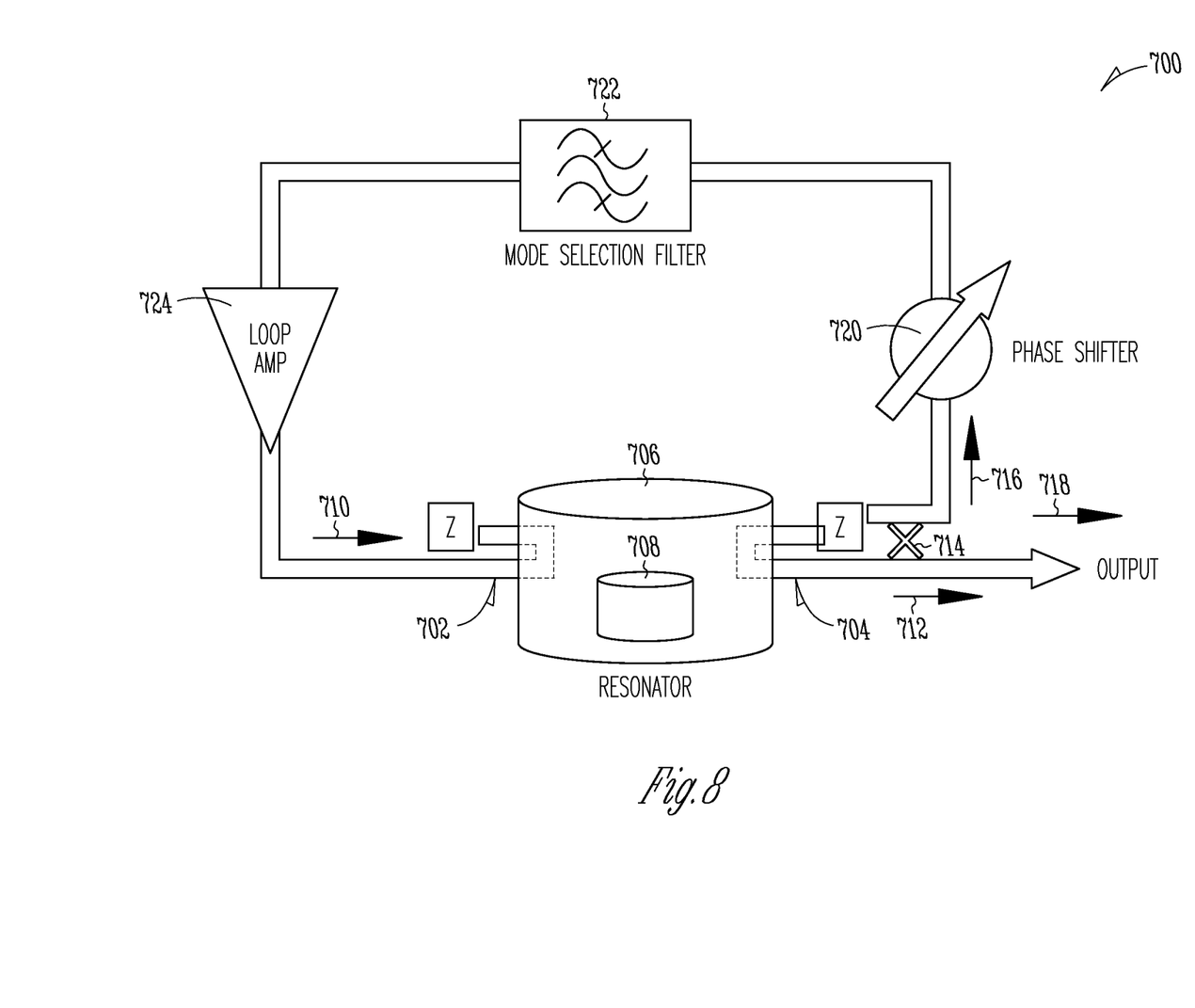
FIG. 8 illustrates an embodiment of a sapphire oscillator in which probes are used to both inject and extract microwave energy to and from the cavity resonator.

Referring now to FIG. 8, the fixed-geometry probes can be configured to exchange microwave energy with a cavity resonator in sapphire oscillator 700. In an embodiment, the sapphire oscillator 700 includes fixed-geometry input and output probes 702 and 704 configured to inject and extract microwave energy from a cavity resonator 706 including a sapphire puck 708. The fixed-geometry probes may be independently set or tuned to provide the desired input and output coupling coefficients as previously described. The input probe is configured to receive amplified microwave energy 710 at the microwave operating frequency and the output probe is configured to deliver microwave energy 712 at the microwave operating frequency to a microwave coupler 714, which is configured to send a first portion 716 of the microwave energy into a loop and a second portion 718 to an output. A phase shifter 720 is configured to set a phase at N*2pi around the loop to satisfy a condition for the sapphire oscillator to oscillate. A mode selection filter 722 is configured to select a mode of the cavity resonator at the microwave operating frequency and an amplifier 724 is configured to provide the amplified microwave energy 710 to the cavity resonator and to provide sufficient to cause the loop to oscillate.

While several illustrative embodiments of the invention have been shown and described, numerous variations and alternate embodiments will occur to those skilled in the art. Such variations and alternate embodiments are contemplated, and can be made without departing from the spirit and scope of the invention as defined in the appended claims.

We claim:

1. A microwave frequency discriminator element, comprising:
   a microwave cavity resonator configured to resonate at a microwave operating frequency; and
   a probe comprising a transmission line having an inner conductor, one or more dielectric layers and one or more outer conductors arranged to provide a characteristic impedance at the microwave operating frequency, wherein the transmission line has a first end lying outside the cavity resonator configured for connection to a microwave circuit to exchange microwave energy and wherein the transmission line enters the cavity resonator, turns and exits the cavity resonator and continues to a second end lying outside the cavity resonator, a portion of the one or more outer conductors being removed from the transmission line lying within the cavity resonator to form a fixed-geometry radiating element to exchange microwave energy with the cavity resonator in accordance with a coupling coefficient, wherein the outer conductor is connected to the cavity resonator on at least one side of the radiating element, the second end of the transmission line being terminated with a terminating impedance creating a mismatch with the characteristic impedance to create a reflective stub comprising a length of the transmission line between the radiating element and the second end, wherein the coupling coefficient is controlled by the length of the reflective stub and terminating impedance.

2. The microwave frequency discriminator element of claim 1, wherein the transmission line is a coaxial cable that enters the cavity through a first hole in a boundary wall of the cavity resonator and exits through a second hole in the boundary wall wherein the portion of the coaxial cable that defines the radiating element lying within the cavity resonator has a U-shaped bend.

3. The microwave frequency discriminator element of claim 1, wherein the transmission line is a stripline that passes through an aperture in a boundary wall of the cavity resonator.

4. The microwave frequency discriminator element of claim 3, wherein the second end of the stripline transitions to a non-stripline transmission line having an inner conductor whose length is adjustable to set the coupling coefficient.

5. The microwave frequency discriminator element of claim 1, wherein the terminating impedance is either an open or short circuit and the length of the reflective stub is selected or trimmed to set the coupling coefficient.

6. The microwave frequency discriminator element of claim 1, wherein the terminating impedance is an open circuit, wherein a nominal length of the reflective stub sets the coupling coefficient near zero, wherein the reflective stub is trimmed to set the coupling coefficient.

7. The microwave frequency discriminator element of claim 1, wherein the value of the terminating impedance is selected or tuned to set the coupling coefficient and the length of the reflective stub is fixed.

8. The microwave frequency discriminator element of claim 1, wherein a first component of microwave energy travels forward through the radiating element and a second component of microwave energy is reflected by the reflective stub, wherein the length of the reflective stub or the value of the terminating impedance determines a phase relationship between the first and second components to set the coupling coefficient.

9. A sapphire oscillator, comprising:
   a microwave cavity resonator including a sapphire puck configured to resonate at a microwave operating frequency;
   input and output probes configured to respectively inject and extract microwave energy from the cavity resonator, each said probe comprising a transmission line having an inner conductor, one or more dielectric layers and one or more outer conductors arranged to provide a characteristic impedance at the microwave operating frequency, wherein the transmission line has a first end lying outside the cavity resonator, wherein the transmission line enters the cavity resonator, turns and exits the cavity resonator and continues to a second end lying outside the cavity resonator, a portion of the one or more outer conductors being removed from the transmission line lying within the cavity resonator to form a fixed-geometry radiating element to exchange microwave energy with the cavity resonator in accordance with a coupling coefficient, wherein the outer conductor is connected to the cavity resonator on at least one side of the radiating element, the second end of the transmission line being terminated with a terminating impedance creating a mismatch with the characteristic impedance to create a reflective stub comprising a length of the transmission line between the radiating element and the second end, wherein the coupling coefficient is controlled by the length of the reflective stub and terminating impedance;
   a first end of the transmission line for the input probe configured to receive amplified microwave energy at the microwave operating frequency;

a first end of the transmission line for the output probe configured to deliver microwave energy at the microwave operating frequency to a microwave coupler, which is configured to send a first portion of the microwave energy into a loop and a second portion to an output;

a phase shifter configured to set a phase at N*2pi around the loop to satisfy a condition for the sapphire oscillator to oscillate;

a mode selection filter configured to select a mode of the cavity resonator at the microwave operating frequency; and an amplifier to provide the amplified microwave energy to the cavity resonator and to provide sufficient gain for the loop to oscillate.

10. The sapphire oscillator of claim 9, wherein the transmission line for the input and output probes are coaxial cables that each enter the cavity through a respective first hole in the cavity resonator and exit through a respective second hole in the resonator, wherein the portion of the coaxial cable that defines the radiating element lying within the cavity resonator has a U-shaped bend, wherein the second end of the coaxial cable terminated in an open circuit and whose length is selected or trimmed to set the respective coupling coefficients.

11. The sapphire oscillator of claim 9, wherein the transmission line for the input and output probes is a stripline that passes through respective aperture in the cavity resonator, wherein the second end of each said stripline transitions to a non-stripline transmission line that is terminated in an open-circuit and having an inner conductor whose length is adjustable to set the coupling coefficient.

12. The sapphire oscillator of claim 9, wherein the terminating impedance is an open circuit, wherein the length of the reflective stub is trimmed to set the coupling coefficient.

13. The sapphire oscillator of claim 12, wherein a nominal length of the reflective stub sets an initial coupling coefficient near zero, wherein the nominal length is trimmed to set the coupling coefficient.

14. The sapphire oscillator of claim 9, wherein a first component of microwave energy travels forward through the radiating element and a second component of microwave energy is reflected by the reflective stub, wherein the length of the reflective stub or the value of the terminating impedance determines a phase relationship between the first and second components to set the coupling coefficient.

15. A method of injecting microwave energy into a cavity resonator, comprising:

providing a probe comprising a transmission line having an inner conductor, a dielectric layer or layers and one or more outer conductors arranged to provide a characteristic impedance at the microwave operating frequency, removing the outer conductor from a central portion of the transmission line to form a radiating element;

inserting the probe into the cavity resonator such that the transmission line enters the cavity resonator leaving a first end lying outside the cavity resonator for connection to a microwave circuit, positions the radiating element inside the cavity resonator to exchange microwave energy into the cavity resonator in accordance with a coupling coefficient, and exits the cavity resonator to a second end lying outside the cavity resonator;

connecting the probe's outer conductor to the cavity resonator on at least one side of the radiating element to fix the geometry of the radiating element;

terminating the second end of the transmission line with a terminating impedance creating a mismatch with the characteristic impedance to create a reflective stub; and after connecting the probe to the cavity resonator, trimming the length of the reflective stub or tuning the terminating impedance to control the coupling coefficient.

16. The method of claim 15, wherein the transmission line is a coaxial cable, wherein the step of inserting the probe comprises inserting the coaxial cable through a first hole in a boundary wall of the cavity resonator, bending the coaxial cable to have a U-shaped bend at the radiating element and inserting the coaxial cable through a second hole in the boundary wall to position the reflective stub outside the cavity resonator.

17. The method of claim 15, wherein the transmission line is a stripline, wherein the step of inserting the probe comprises passing the stripline through an aperture in a boundary wall of the cavity resonator.

18. The method of claim 17, further comprising transitioning the second end of the stripline to a non-stripline transmission line having an inner conductor whose length is adjustable to set the coupling coefficient.

19. The method element of claim 15, wherein the terminating impedance is an open circuit, wherein a nominal length of the stub sets the coupling coefficient near zero, wherein the reflective stub is trimmed to set the coupling coefficient.

20. The method element of claim 15, wherein a first component of microwave energy travels forward through the radiating element and a second component of microwave energy is reflected by the reflective stub, wherein the length of the reflective stub or the value of the terminating impedance determines a phase relationship between the first and second components to set the coupling coefficient.

* * * * *

UNITED STATES PATENT AND TRADEMARK OFFICE
CERTIFICATE OF CORRECTION

PATENT NO. : 11,791,532 B1
APPLICATION NO. : 17/887043
DATED : October 17, 2023
INVENTOR(S) : Moore et al.

It is certified that error appears in the above-identified patent and that said Letters Patent is hereby corrected as shown below:

In the Specification

In Column 5, Line 25, delete "ZO" and insert --Z0-- therefor

In Column 6, Line 11, delete "118" and insert --90-- therefor

In Column 9, Line 6, delete "ZO" and insert --Z0-- therefor

Signed and Sealed this
Twenty-ninth Day of October, 2024

Katherine Kelly Vidal
*Director of the United States Patent and Trademark Office*